(12) United States Patent
Tews et al.

(10) Patent No.: US 6,426,253 B1
(45) Date of Patent: Jul. 30, 2002

(54) METHOD OF FORMING A VERTICALLY ORIENTED DEVICE IN AN INTEGRATED CIRCUIT

(75) Inventors: Helmut Horst Tews, Poughkeepsie, NY (US); Alexander Michaelis, Dormagen (DE); Brian S. Lee, New York, NY (US); Uwe Schroeder; Stephan Kudelka, both of Fishkill, NY (US)

(73) Assignee: Infineon Technologies A G, Munich (DE)

( * ) Notice: Subject to any disclaimer, the term of this patent is extended or adjusted under 35 U.S.C. 154(b) by 0 days.

(21) Appl. No.: 09/576,465

(22) Filed: May 23, 2000

(51) Int. Cl.$^7$ .......................................... H01L 21/8242
(52) U.S. Cl. ...................................... 438/243; 438/386
(58) Field of Search ................................ 438/243, 244, 438/248, 386, 387, 391, 525

(56) References Cited

U.S. PATENT DOCUMENTS

| | | | |
|---|---|---|---|
| 5,885,425 A | * | 3/1999 | Hsieh et al. |
| 6,040,213 A | * | 3/2000 | Canale et al. |
| 6,107,153 A | * | 8/2000 | Huang et al. |
| RE37,228 E | * | 6/2001 | Fuse et al. |
| 6,265,279 B1 | * | 7/2001 | Radens et al. |

* cited by examiner

*Primary Examiner*—Tuan H. Nguyen
(74) *Attorney, Agent, or Firm*—Stanton Braden

(57) ABSTRACT

A system and method of forming an electrical connection (142) to the interior of a deep trench (104) in an integrated circuit utilizing a low-angle dopant implantation (114) to create a self-aligned mask over the trench. The electrical connection preferably connects the interior plate (110) of a trench capacitor to a terminal of a vertical trench transistor. The low-angle implantation process, in combination with a low-aspect ratio mask structure, generally enables the doping of only a portion of a material overlying or in the trench. The material may then be subjected to a process step, such as oxidation, with selectivity between the doped and undoped regions. Another process step, such as an etch process, may then be used to remove a portion of the material (120) overlying or in the trench, leaving a self-aligned mask (122) covering a portion of the trench, and the remainder of the trench exposed for further processing. Alternatively, an etch process alone, with selectivity between the doped and undoped regions, may be used to create the mask. The self-aligned mask then allows for the removal of selective portions of the materials in the trench so that a vertical trench transistor and a buried strap may be formed on only one side of the trench.

27 Claims, 12 Drawing Sheets

METHOD OF FORMING A VERTICALLY ORIENTED DEVICE IN AN INTEGRATED CIRCUIT

TECHNICAL FIELD

The present invention relates generally to a system and method for fabricating integrated circuits ("IC"s), and more particularly to a system and method for forming a vertically oriented device in an integrated circuit.

BACKGROUND

The semiconductor industry is continuously trying to decrease the size of the semiconductor devices located on integrated circuits. Miniaturization is generally needed to accommodate the increasing density of circuits necessary for today's semiconductor products. For example, it is not uncommon for there to be millions of semiconductor devices on a single semiconductor product.

Typically, the focus of miniaturization has been placed on the two-dimensional horizontal plane of a semiconductor device, and devices have approached sizes down to tenths of microns and less. There is some limit, however, as to how far a horizontally oriented semiconductor device can be shrunk, and as devices are made even smaller, it is generally becoming increasingly difficult to further miniaturize a device's horizontal dimensions. In addition, the decreasing horizontal dimensions of semiconductor devices generally tend to create problems in the operational characteristics of the semiconductor devices.

One such semiconductor product widely used in electronic systems for storing data is a semiconductor memory, and one common type of semiconductor memory is a dynamic random access memory ("DRAM"). A DRAM may include millions or billions of individual DRAM cells, each cell storing one bit of data. A DRAM memory cell typically includes an access field-effect transistor ("FET") and a storage capacitor. The access FET allows the transfer of data charges to and from the storage capacitor during reading and writing operations. In addition, the data charges on the storage capacitor are periodically refreshed during a refresh operation.

Semiconductor memory density is typically limited by a minimum lithographic feature size that is imposed by lithographic processes used during fabrication. There is a continuing need in the art to provide even higher density memories in order to further increase data storage capacity and reduce manufacturing costs.

One way of increasing the data storage capacity of semiconductor memories is to reduce the amount of integrated circuit horizontal planar area consumed by each memory cell. For horizontally oriented devices, this may be done by decreasing the size of the access FET or the storage capacitor, or both. This approach has limits, however, due to minimum producible structure size in a given fabrication technology, and the problems associated with devices with small dimensions, such as hot carriers, punch through, and excess leakage.

Another way of providing planar area reduction is the use of a three-dimensional arrangement of the access FET and the storage capacitor. One such arrangement is a planar FET next to a deep trench capacitor. The trench capacitor has plates which are located vertically along the walls of the trench instead of being parallel to the surface of the integrated circuit substrate. This permits a large capacitance per planar unit area of substrate, while at the same time allowing the device to be of a manageable size for purposes of operation.

To still further reduce the amount of planar area required for each cell, it has been proposed to use a vertical trench transistor in conjunction with a vertical trench capacitor in a memory cell. In a typical design, the vertical capacitor is generally fabricated in a trench, with one conductive plate being formed in the substrate, the dielectric being formed on the trench sidewalls, and the other conductive plate being formed in the interior of the trench. A vertical trench transistor is generally fabricated adjacent to an upper portion of the trench, with the source and drain being fabricated in the substrate, and the vertically-oriented gate being fabricated in the trench.

There are generally several problems, however, with prior art approaches to fabricating a vertical transistor in a DRAM cell. One difficult fabrication issue is that either the source or the drain of the vertical transistor must generally make electrical contact with the interior plate of the trench capacitor in order to form a basic memory cell circuit. This is typically accomplished through the formation of an asymmetrical buried strap junction on only one side of the trench capacitor. The buried strap electrically connects the interior plate of the capacitor to the source or drain of the vertical transistor. Creating an asymmetrical structure at some distance within the narrow trench has proved to be a difficult task in the prior art.

One prior art approach to fabricating the buried strap is to utilize a deep ultraviolet ("DUV") mask process to aid in forming the asymmetrical buried strap. A DUV mask allows one portion of the trench to be processed differently from another portion of the trench, and thus enables the formation of an asymmetrical structure within the trench. DUV masks are expensive, however, and their use in the fabrication process should be kept to a minimum.

Another approach that has been suggested is the use of a high-aspect angled implantation process to aid in forming the buried strap. This approach also allows one portion of the trench to be processed differently than another portion of the trench, in this case because implanted and non-implanted variations of the same material may have very different processing characteristics. This difference may be used to one's advantage to form an asymmetrical structure within the trench. A processing difficulty with this approach, however, is that to reach a sufficient depth into the trench, the dopant must be implanted using carefully controlled high-angle implantation (e.g., 85 degrees or higher with respect to the substrate, but less than 90 degrees). In addition, the structure generally must have a high-aspect ratio (e.g., 10:1 or higher, height of mask sidewall to width of trench) to serve as a mask so that only a portion of the trench is doped by the implantation process (e.g., the upper portion of one side). This approach may be sensitive to process variations, and not sufficiently robust for a production environment.

Accordingly, there exists in the prior art a need for a less difficult and costly method of forming a vertical trench transistor connected to a trench capacitor via a buried strap junction, especially for use in a DRAM memory cell.

SUMMARY OF THE INVENTION

These problems are generally solved or circumvented, and technical advantages are generally achieved, by a preferred embodiment of the invention in which an electrical connection to the interior of a deep trench is formed in an integrated circuit utilizing a low-angle dopant implantation to create a self-aligned mask over the trench. Preferably, the electrical connection, or buried strap, connects the interior plate of a trench capacitor to a terminal of a vertical trench transistor.

A low-angle implantation process, in combination with a low-aspect ratio mask structure, generally enables the doping of only a portion of a material overlying or in the trench. As used herein with respect to the implantation process, the term "low-angle" means about 80 degrees or less, preferably about 75 degrees or less, more preferably about 60 degrees or less, and most preferably between about 30 degrees and about 60 degrees. As used herein with respect to the implantation mask height to width ratio, the term "low-aspect" means about 4:1 or less, preferably about 3:1 or less, and more preferably about 2:1 or less. The material may then be subjected to a process step, such as oxidation, with selectivity between the doped and undoped regions. Another process step, such as an etch process, may then be used to remove a portion of the material overlying or in the trench, leaving a self-aligned mask covering a portion of the trench, and the remainder of the trench exposed for further processing. Alternatively, an etch process alone, with selectivity between the doped and undoped regions, may be used to create the mask.

The self-aligned mask then allows for the removal of selective portions of the materials in the trench so that a vertical trench transistor and a buried strap may be formed on only one side of the trench. The remaining materials in the trench protect the other sections of the trench from the processes forming the transistor and buried strap.

In accordance with a preferred embodiment of the present invention, a method of forming an electrical connection to an interior plate of a trench capacitor located in a deep trench on a semiconductor substrate comprises low-angle implanting a dopant into exposed regions of a mask layer overlying the semiconductor substrate, wherein the mask layer comprises a low-aspect ratio well over the deep trench, and wherein a shielded region of the mask layer overlying the deep trench is shielded from the implanting by a sidewall of the well and thereby remains undoped; removing either the doped exposed regions or the undoped shielded region of the mask using a dopant-level selective semiconductor process, thereby exposing a first region of the deep trench, wherein a second region of the deep trench remains masked; and forming a buried strap in the first region of the deep trench, wherein the buried strap electrically connects the interior plate to a portion of an upper substrate sidewall of the deep trench.

In accordance with another preferred embodiment of the present invention, a method of forming an electrical connection between an interior plate of a trench capacitor and a terminal of a vertical trench transistor, the capacitor and the transistor located in a deep trench on a semiconductor substrate comprises forming an undoped mask layer overlying the substrate, the mask layer forming a well with sidewalls over the deep trench, the well having a low-aspect height to width ratio; low-angle implanting a dopant into the mask layer, wherein an exposed region of the mask layer overlying the deep trench becomes doped, and wherein a shielded region of the mask layer overlying the deep trench is shielded from the implanting by one of the well sidewalls and thereby remains undoped; removing either the doped exposed region or the undoped shielded region of the mask using a dopant-level selective semiconductor process, thereby exposing a first region of the deep trench, wherein a second region of the deep trench remains masked; removing material from the first region of the deep trench, thereby exposing a upper substrate sidewall of the deep trench; depositing a conductive layer to form a buried strap electrically connecting the interior plate to a portion of the upper substrate sidewall; and forming the transistor on the upper substrate sidewall in the first region of the deep trench, wherein the terminal of the transistor is electrically connected to the buried strap.

In accordance with yet another preferred embodiment of the present invention, a method of forming a DRAM integrated circuit, the method comprises forming a storage capacitor in a deep trench in a semiconductor substrate, the capacitor having an interior plate located inside the deep trench; forming an undoped mask layer overlying the substrate, the mask layer forming a well with sidewalls over the deep trench, the well having a low-aspect height to width ratio; low-angle implanting a dopant into the mask layer, wherein an exposed region of the mask layer overlying the deep trench becomes doped, and wherein a shielded region of the mask layer overlying the deep trench is shielded from the implanting by one of the well sidewalls and thereby remains undoped; removing either the doped exposed region or the undoped shielded region of the mask using a dopant-level selective semiconductor process, thereby exposing a first region of the deep trench, wherein a second region of the deep trench remains masked; removing material from the first region of the deep trench, thereby exposing a upper substrate sidewall of the deep trench; depositing a conductive layer to form a buried strap electrically connecting the interior plate to a portion of the upper substrate sidewall; and forming a vertical transistor on the upper substrate sidewall, wherein a terminal of the transistor is electrically connected to the buried strap.

The formation of the trench capacitor may comprise forming a deep trench in the substrate using a patterned mask; forming a collar oxide on an upper interior surface of the deep trench, leaving a lower portion of the deep trench uncovered with the collar oxide; forming a first plate in the substrate adjacent the deep trench; forming a node dielectric on an interior surface of the deep trench and covering the collar oxide, and forming the interior plate on an interior surface of the node dielectric and filling at least a portion of an interior of the deep trench.

The formation of the vertical transistor may comprise forming a drain in the substrate adjacent a lower portion of the upper substrate sidewall as the terminal electrically connected to the buried strap; forming a vertical gate insulator in the trench on the upper substrate sidewall; forming a gate in the trench adjacent the gate insulator; and forming a source terminal in the substrate adjacent an upper portion of the upper substrate sidewall.

An advantage of a preferred embodiment of the present invention is that a DRAM memory cell may be formed with a trench capacitor and a vertical transistor, thus using devices of manageable size yet occupying minimal horizontal planar area.

Another advantage of a preferred embodiment of the present invention is that the buried strap and vertical trench transistor may be formed without the use of expensive DUV mask processes.

Another advantage of a preferred embodiment of the present invention is that the buried strap and vertical transistor may be formed with a more robust process than one using a high-angle implantation and high-aspect ratio structure approach.

Another advantage of a preferred embodiment of the present invention is that the mask created for use in selective processing of the trench is self-aligned with the trench.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention. The figures are drawn so as to clearly illustrate the relevant aspects of the preferred embodiments, and are not necessarily drawn to scale.

The invention relates to integrated circuits, including memory ICs such as random access memories ("RAM"s), DRAMs, synchronous DRAMS("SDRAM"s), merged DRAM-logic circuits ("embedded DRAM"s), or other circuits. The invention also relates to semiconductor processes and structures, including vertical capacitors, vertical transistors, trench capacitors and trench transistors, the connections between such semiconductor devices, or other processes and structures.

The preferred embodiments of the present invention take advantage of a property of some integrated circuit processes, specifically the selectivity of those processes based on the dopant level of a given material. The preferred embodiments will be discussed with respect to specific materials, such as doped and undoped polycrystalline silicon ("polysilicon" or "poly"), and specific processes, such as oxidation and etching, that are selective based on the level of material doping. The invention applies, however, to other doped and undoped materials used in semiconductor processing. In addition, the invention applies to other semiconductor processes that are sufficiently selective based on the level of doping in a given material.

As a specific example, the oxidation rate of polysilicon varies substantially based on its doping level. In particular, the oxidation rate of highly doped polysilicon is significantly higher than that of low or undoped polysilicon. As another example, the etch rate of undoped or lightly doped polysilicon is significantly higher than that of highly doped polysilicon.

Figure 1:
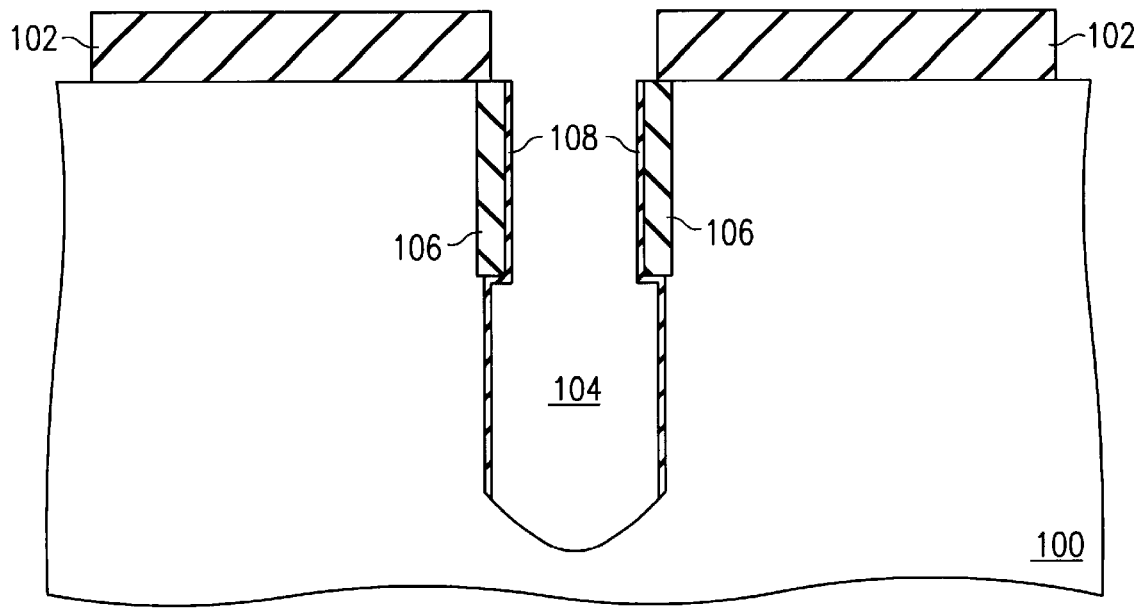
FIGS. 1–12 are cross-sectional views of an integrated circuit structure in accordance with a preferred embodiment of the present invention at various stages of fabrication.

Referring now to FIG. 1, there is illustrated semiconductor substrate 100 in which some initial processing has already been performed. Substrate 100 preferably comprises silicon, although it may comprise other semiconductor materials, such as gallium arsenide. Substrate 100 is consistently assumed to be a p-substrate for ease of discussion, although an n-substrate may also be employed to form trench capacitors, as is well known to those skilled in the art. Pad nitride 102 is formed on the surface of substrate 100 to protect the substrate surface during subsequent processing. Pad nitride layer 102 may represent a layer of $N_xO_y$ and may be, for example, 150 to 250 nm thick, although other suitable protective materials and thicknesses may be used. A hard mask layer such as silicon dioxide is formed on pad nitride layer 102, and is then patterned using photolithographic techniques to form the mask for the deep trench etch. Trench 104 is formed in substrate 100 using a suitable etching process, preferably dry etching, and more preferably reactive ion etching ("RIE"). The hard mask layer then may be removed. Preferably, deep trench 104 is between 5 and 10 microns deep, and may be as small as 150 nm across or smaller, although other dimensions may be used depending on the particular application.

Within trench 104, collar oxide 106 is formed on the upper portion of the trench sidewalls, down to about 1.5 microns into the trench, and is generally for the purposes of providing isolation and preventing the formation of parasitic elements. Collar oxide 106 is preferably formed from silicon dioxide, although any other suitable insulative material such as silicon nitride may be used. Collar oxide 106 may be formed by a Local Oxidation of Silicon ("LOCOS") process, by a tetraethyloxysilane decomposition process ("TEOS process"), or by any other suitable oxide formation process. A buried plate, which will function as the first plate of the trench capacitor, is formed in the trench walls underneath collar oxide 106. Methods of formation include, for example, gasphase doping, chemical vapor deposition, plasma vapor deposition, sputtering or any other suitable deposition technique. Node dielectric 108 is then formed on the trench sidewalls and the exposed walls of collar oxide 106. Node dielectric 108 will function as the capacitor dielectric, and is preferably silicon nitride, but may be formed of other high dielectric constant materials, such as $ZrO_2$, $HfO_2$, and $Al_2O_3$.

Figure 2:
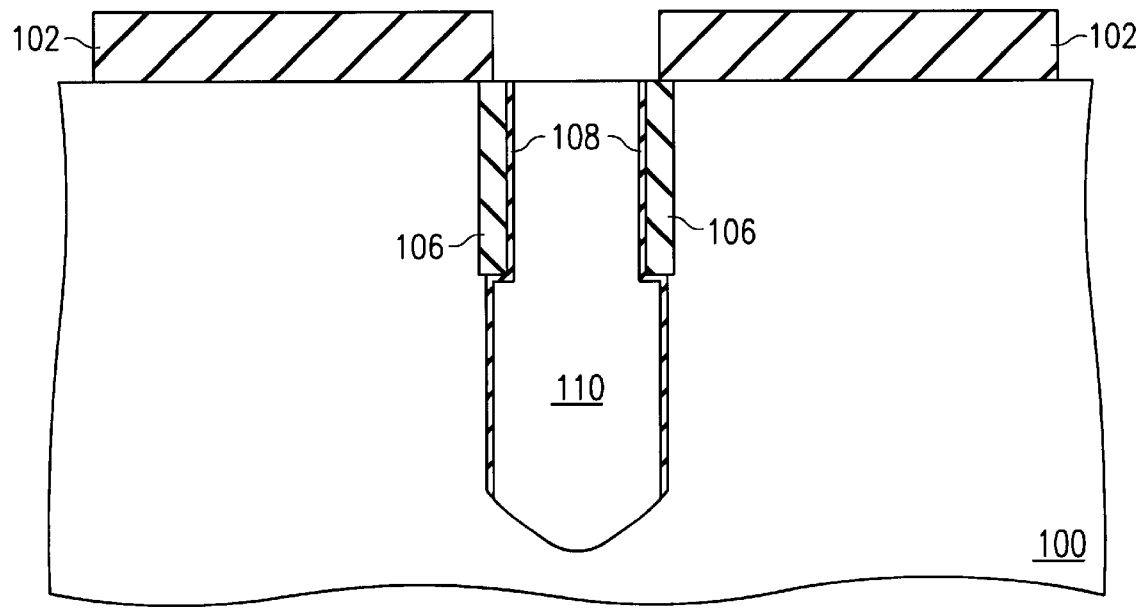

Referring to FIG. 2, trench 104 is filled with a material, such as heavily doped polysilicon 110, that will form the inner plate of the trench capacitor. Polysilicon 110 is deposited over the entire substrate filling the trench 104 and then is planarized/recessed down to approximately the level of substrate below pad nitride layer 102 using chemical mechanical polishing ("CMP"). Planarization and/or recessing may be also accomplished by, for example, polishing, etching, recessed etching or any other suitable recessing technique.

Figure 3:
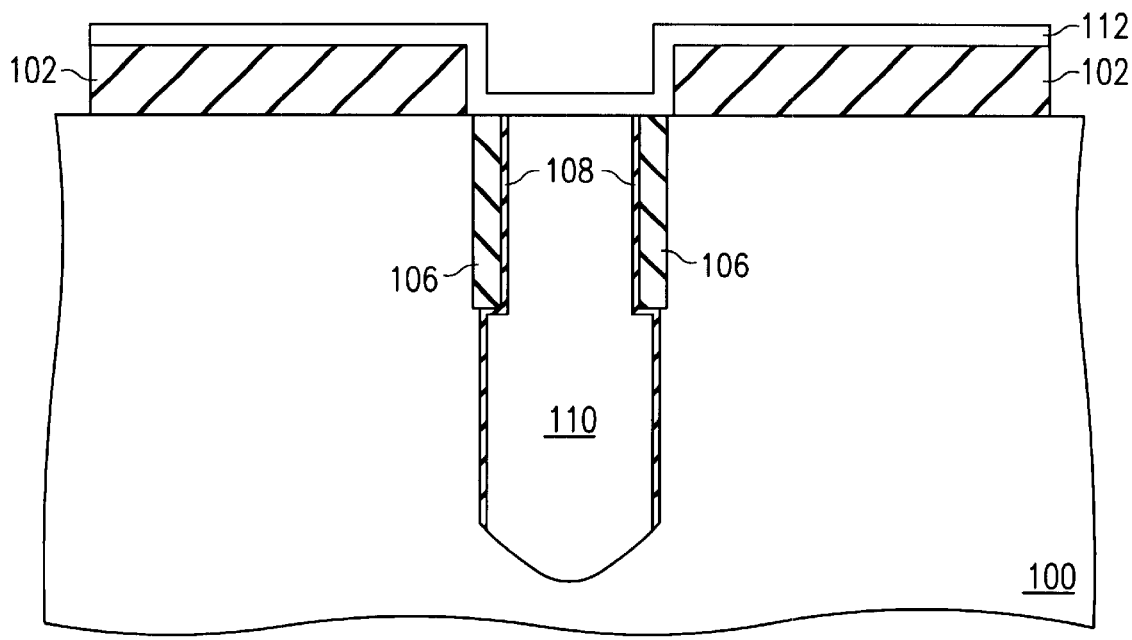

Referring to FIG. 3, pad nitride layer 102 is etched back from over collar oxide 106 to widen the opening over the trench. Intrinsic polysilicon layer 112 is then conformally deposited over the structure using chemical vapor deposition, preferably to a thickness of about 20 to 40 nm. This creates a well structure having a low-aspect ratio, e.g., 2:1 or less, overlying the trench, which can serve the function of a mask in subsequent processing steps.

Figure 4:
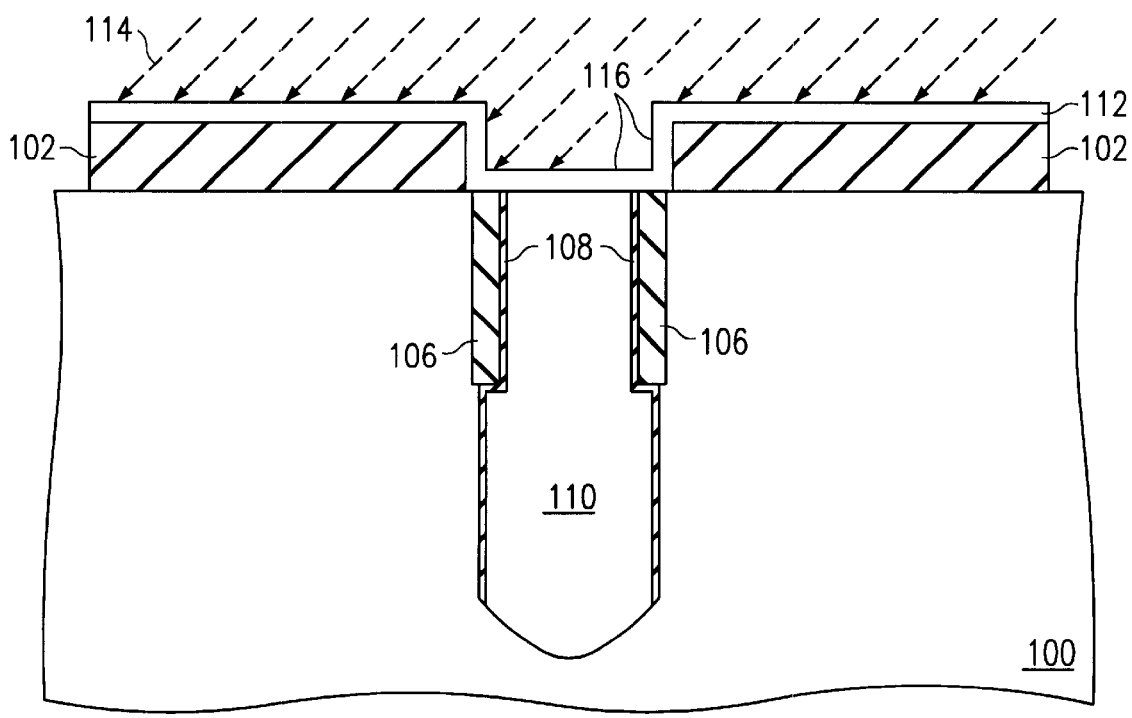

Referring to FIG. 4, low-angle dopant implantation 114 is then performed on polysilicon layer 112. The dopant may be n-type or p-type, such as boron, arsenic, or phosphorus, or any other integrated circuit dopant materials. As can be seen in FIG. 4, because of the low angle of the dopant implantation, the sidewall of polysilicon layer 112 protects shielded regions 116 from being implanted with the dopant. The preferred dosage is about $1E10^{13}$ to $1E10^{14}$ ions/cm$^3$, although other dosages may be used as long as sufficient selectivity is provided with respect to undoped or more lightly doped regions in subsequent processing steps. The dosage level is preferably set to facilitate stripping of the implanted mask later in the process.

Figure 5:
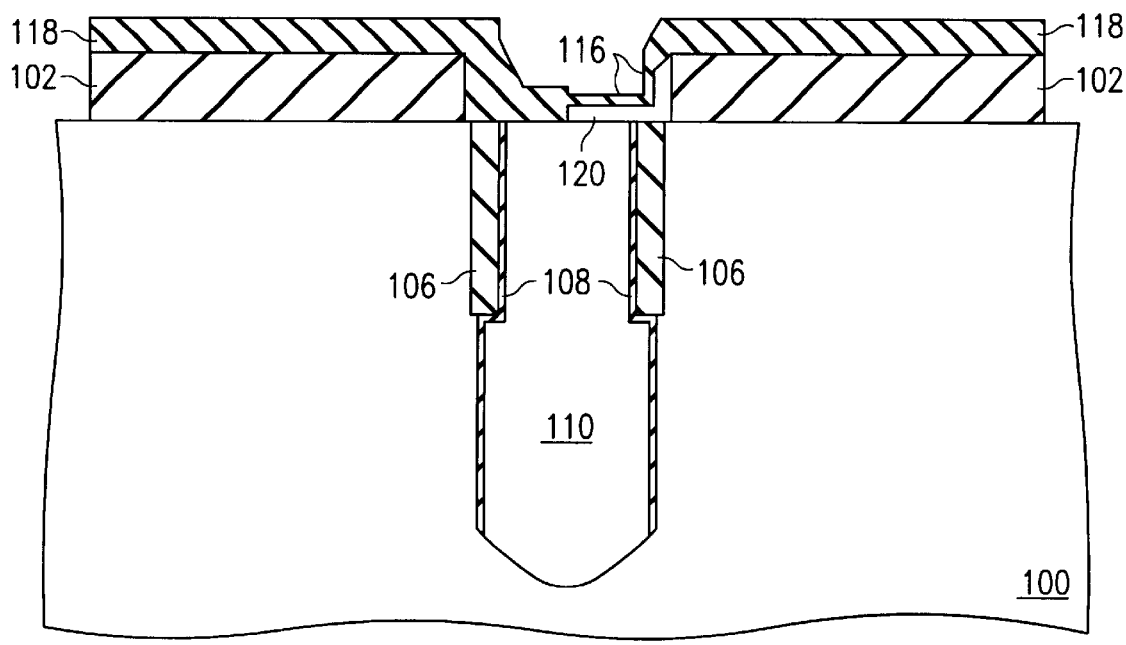
Figure 6:
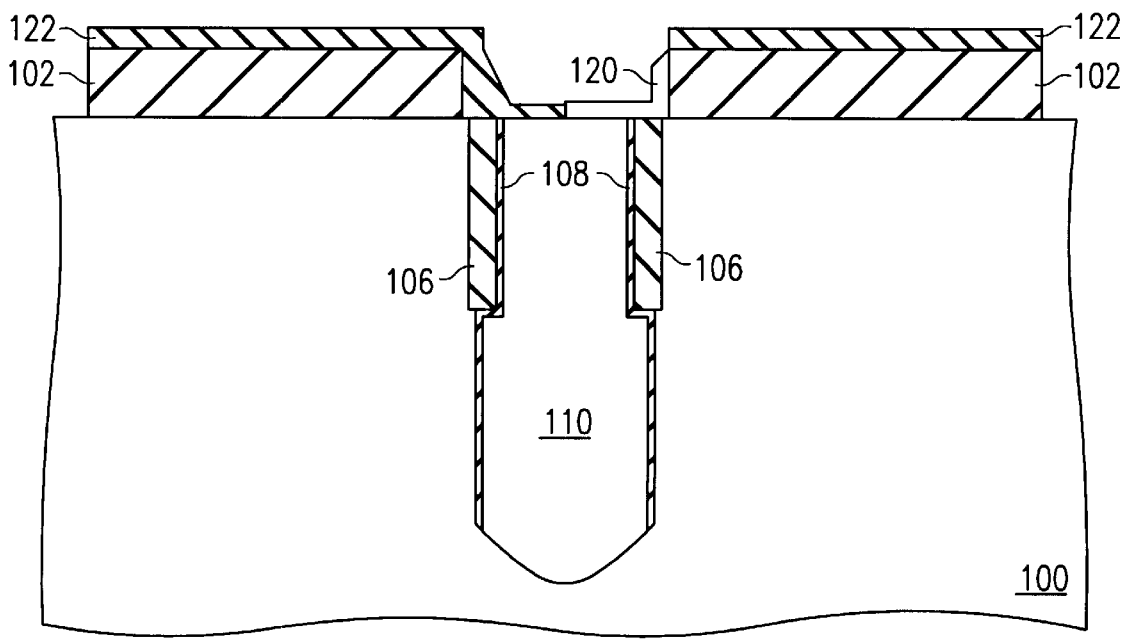
Figure 7:
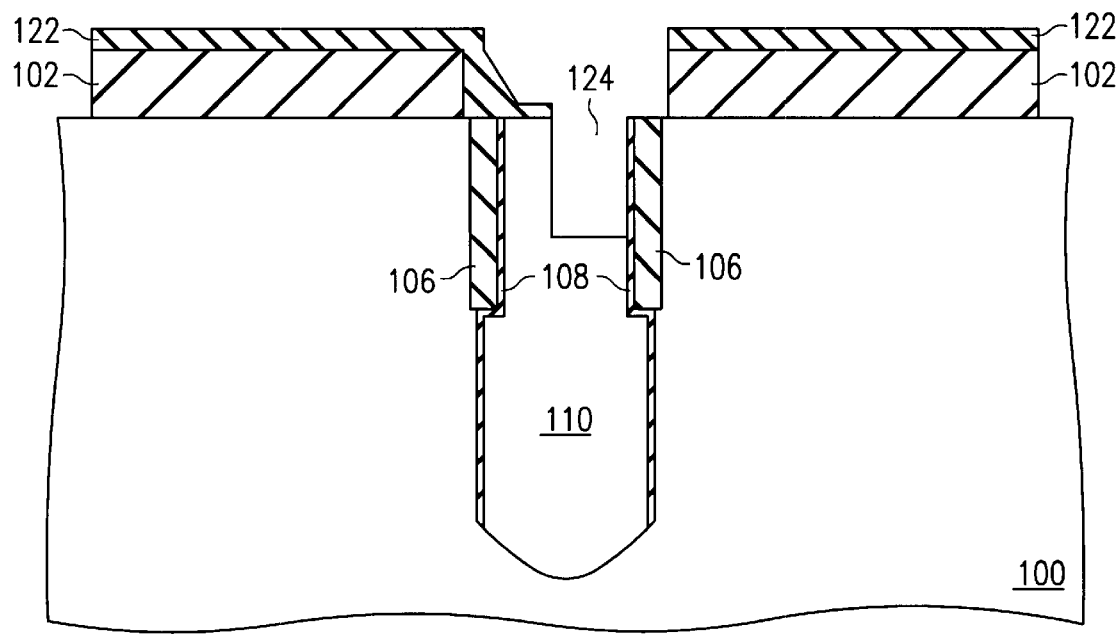

FIG. 5 illustrates the results of one semiconductor process which has high selectivity between doped and undoped polysilicon. Polysilicon layer 112 is subjected to a thermal oxidation process which oxidizes doped polysilicon much faster than undoped polysilicon. In FIG. 5, the doped polysilicon regions have been substantially completely oxidized into silicon dioxide 118. In contrast, shielded regions 116, containing undoped polysilicon, are only partially oxidizes, leaving undoped polysilicon layer 120 overlying a portion of the trench. A partial oxide etch is then performed in FIG. 6, to the extent necessary to expose undoped polysilicon layer 120, located between silicon dioxide layers 122. The oxidation selectivity between doped and undoped polysilicon thus provides a self aligned method of creating a mask for delineating different regions of the underlying trench. As shown in FIG. 7, polysilicon layer 120 may be removed by etching, exposing portions of underlying polysilicon layer 110, node dielectric 108 and collar oxide 106. A polysilicon recess process is then performed to create recessed region 124 in the trench, exposing a portion of node dielectric 108 and collar oxide 106, while the remaining areas of node dielectric 108 and collar oxide 106 are protected by the polysilicon layer.

Figure 8:
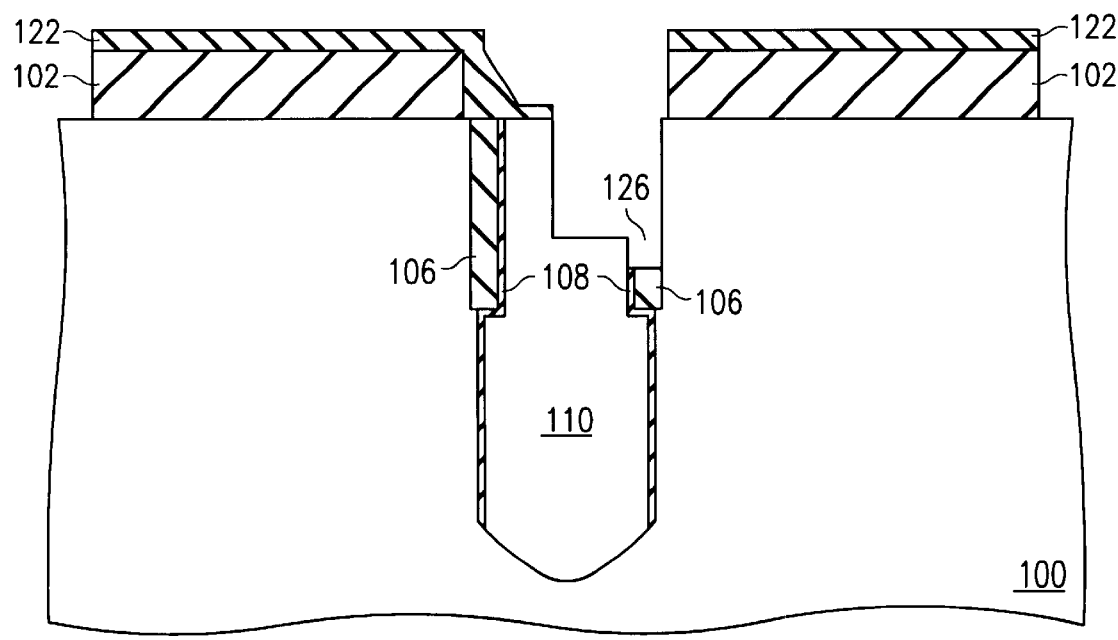

Referring to FIG. 8, the exposed areas of node dielectric 108 and collar oxide 106 must be removed. First, node dielectric 108 is etched in recessed region 124. This is followed by an oxide etch to remove the collar oxide 106 from recessed region 124, and then further down into divot 126. Again, polysilicon layer 110 protects the remaining regions of node dielectric 108 in collar oxide 108. Finally the remaining portion of node dielectric 108 in the divot 126 is etched down to about the level of collar oxide 106. Silicon substrate 100 is thus exposed on one side of the trench, enabling the formation of a single sided trench transistor, together with a buried strap connection to the trench capacitor.

Figure 9:
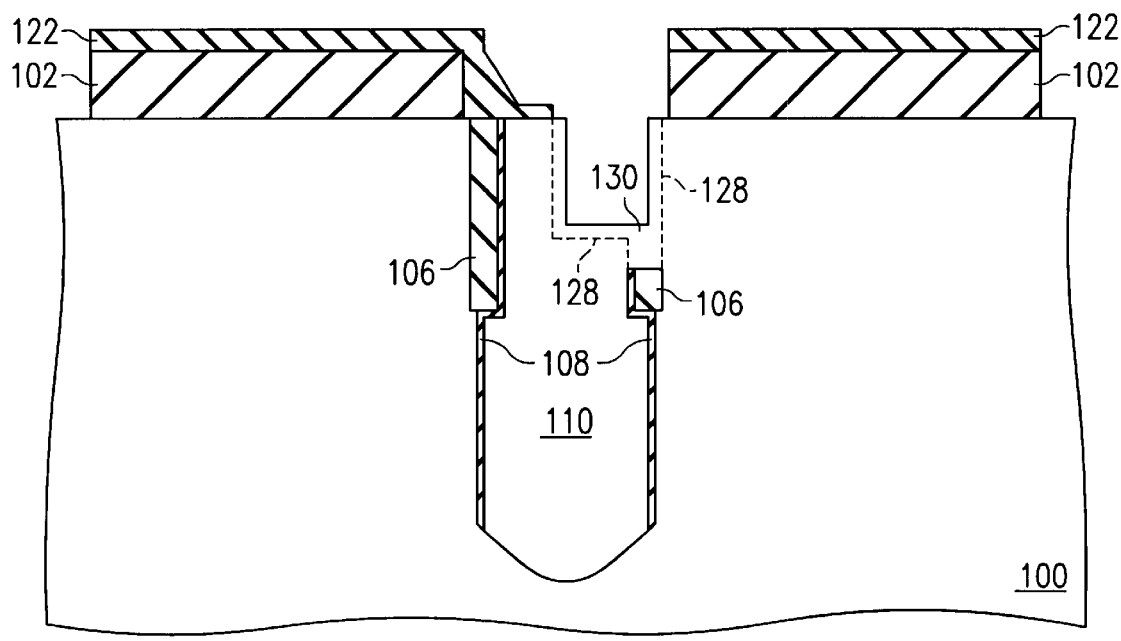

Referring to FIG. 9, the exposed surface of polysilicon layer 110 and the exposed surface of silicon substrate 100 are nitrided to form nitrided surfaces 128. Then intrinsic polysilicon is deposited in the trench to fill in the divot with intrinsic polysilicon layer 130. The polysilicon in the divot region will be used to form a buried strap connection electrically connecting the inner plate of the trench capacitor to a terminal of the vertical trench transistor.

Figure 10:
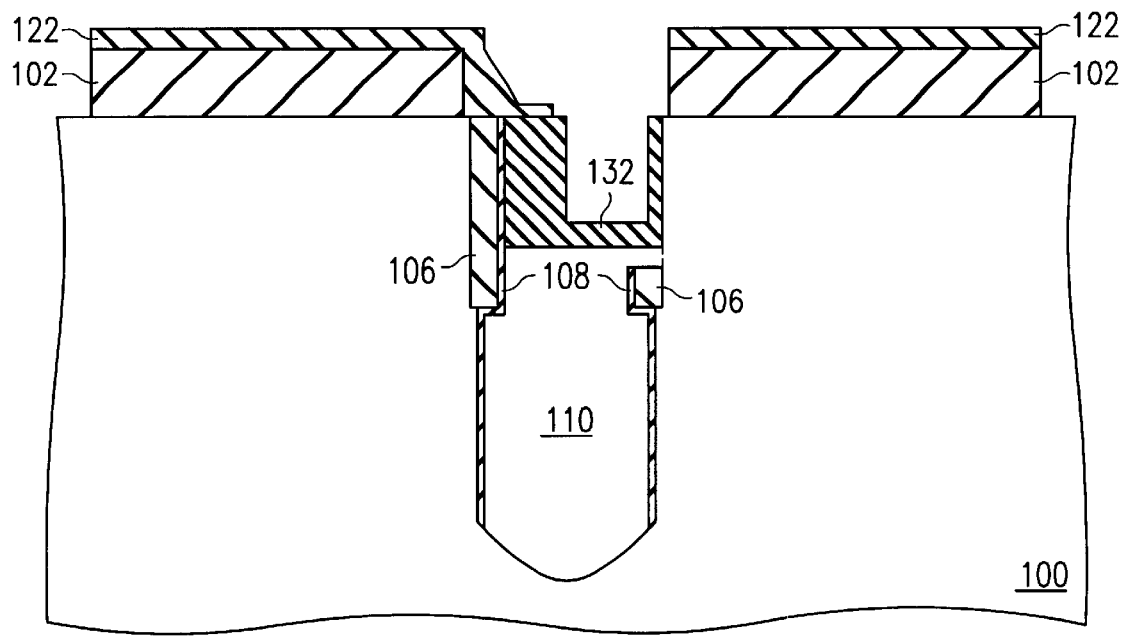

As shown in FIG. 10, excess polysilicon is removed from the trench using a wet selective polysilicon etch. Preferably about 300 angstroms of polysilicon is removed from the exposed areas in the trench, leaving the desired amount of polysilicon in the divot area above the etched collar oxide 106. Next, a sacrificial oxidation is performed, allowing the removal of the heavily doped polysilicon layer still protecting the remaining areas of collar oxide 106 and node dielectric 108. This process is also selective, because the heavily doped polysilicon layer oxidizes much more rapidly than the lightly doped nitrided vertical surface of silicon substrate 100. The resulting oxidized polysilicon layer 132 is shown in FIG. 10. As shown in FIG. 10, the oxide is much thicker in the areas where there were thick layers of heavily doped polysilicon, than in the area where there was a thin layer of heavily doped polysilicon covering lightly doped silicon.

Figure 11:
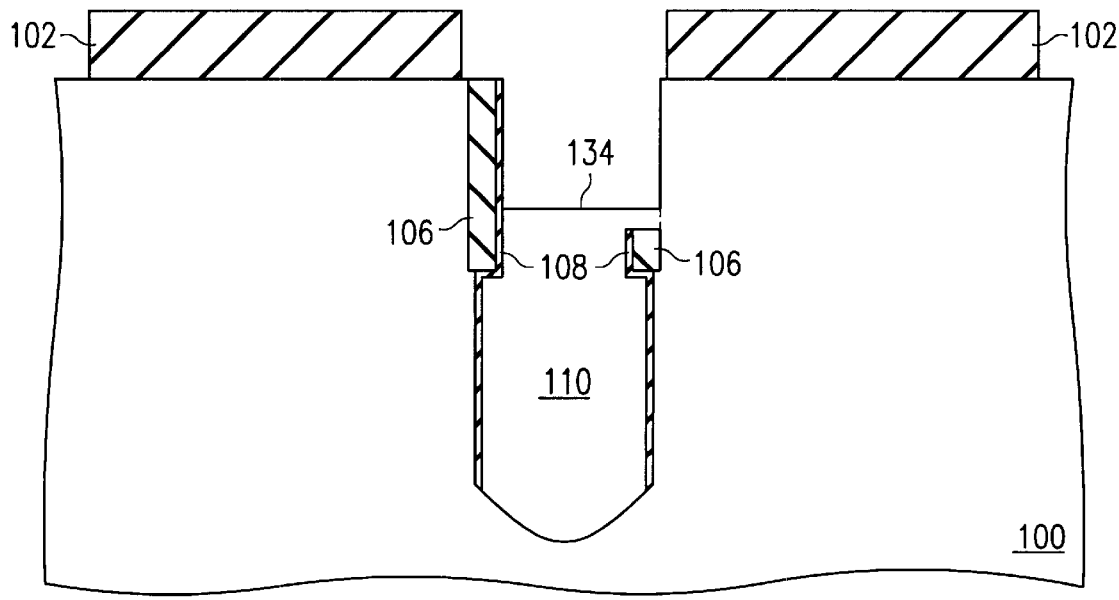

A sacrificial oxide etch is then used to remove oxidized layer 132, along with silicon dioxide layers 122, resulting in the structure illustrated in FIG. 11. A trench capacitor comprises an inner plate of polysilicon layer 110, a node dielectric 108, and an outer plate of doped silicon in silicon substrate 100 surrounding node dielectric 108. Polysilicon layer 110 has exposed surface 134, and a buried strap connection to silicon substrate 100 just over the etched collar oxide 106 and node dielectric 108, providing a conductive path from the inner plate of the trench capacitor to the silicon substrate outside the trench. Preferably the buried strap is about 200 angstroms thick.

Alternatively, only a partial oxide strip may be used, leaving a layer of oxidized polysilicon on collar oxide 106 and node dielectric 108 on the left-hand side of the trench. The extra insulation may be beneficial, for example, if a high voltage is used with the circuit.

Figure 12:
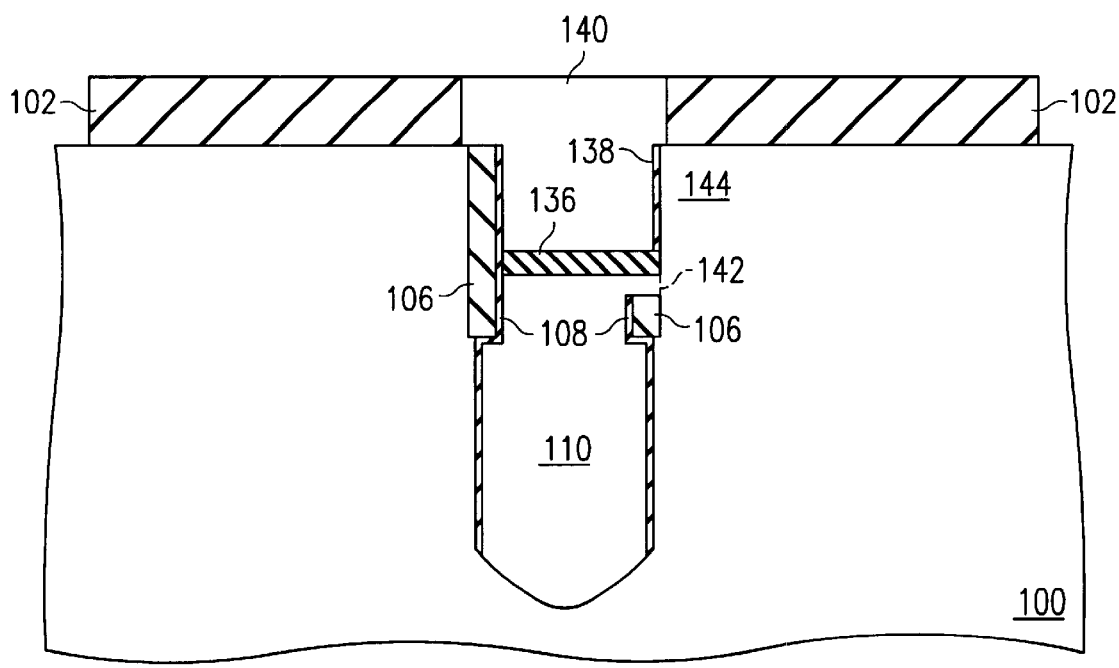

Referring to FIG. 12, trench top oxide 136 is deposited on polysilicon layer 110 in order to isolate the trench capacitor and buried strap 142 in the lower part of the trench from the top part. Trench top oxide is preferably silicon dioxide, but may be silicon nitride or any other suitable insulator material. Then the vertical trench transistor is formed in the upper right region of the trench with active area 144 located in silicon substrate 100. A drain is formed (at this point or previously) in the lower portion of active area 144, connected to buried strap 142 and thus to inner plate 110 of the trench capacitor.

Gate insulator 138 is then formed vertically on the trench wall alongside active area 144. Gate insulation layer 138 is formed on one side of the trench only. Gate insulation layer 138 may be formed, for example, by a dry oxidation or thermal oxidation technique or any other suitable deposition technique. Gate insulation layer 138 is preferably silicon dioxide, but may also be silicon nitride or any other suitable insulative material.

A polysilicon fill is then used to fill in the top part of the trench to create gate 140. Gate 140 may be planarized or recessed. Finally, an implant is done to form the source for the transistor in the upper portion of active area 144. Alternatively, the source and drain of the vertical transistor may be switched.

The remainder of a DRAM cell, including connections to word and bit lines, may be completed using conventional DRAM processing techniques. The resulting DRAM may then be employed in a variety of commercial and consumer electronics devices, including computers.

In an alternative process scheme, a similar approach is used, except that the selective process used is an etch process, relying on the property that the etch rates of doped and undoped polysilicon are significantly different.

Figure 13:
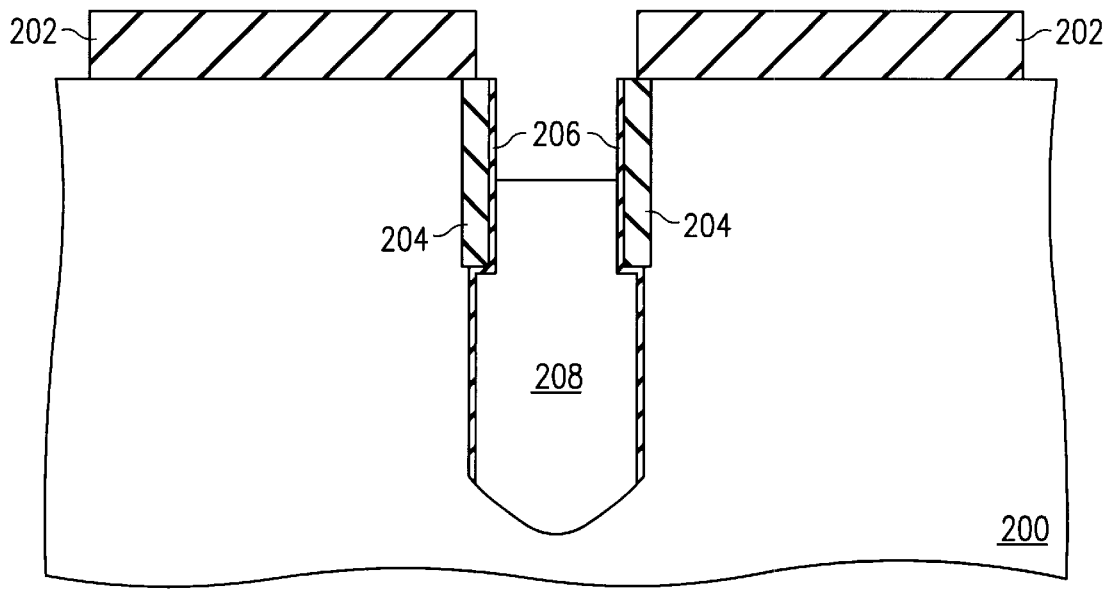
FIGS. 13–24 are cross-sectional views of an integrated circuit structure in accordance with another preferred embodiment of the present invention at various stages of fabrication.

Referring now to FIG. 13, there is shown a structure similar to the one shown in FIG. 2. Processes and materials which are similar to those used in the prior embodiment are described only briefly in this embodiment. A trench is formed in silicon substrate 200 using a hard mask formed on top of pad nitride 202. Collar oxide 204 is formed on and upper portion of the trench and node dielectric 206 is formed on the side walls of the trench and on collar oxide 204. Trench is then filled with low resistance polysilicon layer 208. CMP and a recessed process are used to etch polysilicon layer 208 down into the trench, while the other areas of the substrate are protected by pad nitride 202.

Figure 14:
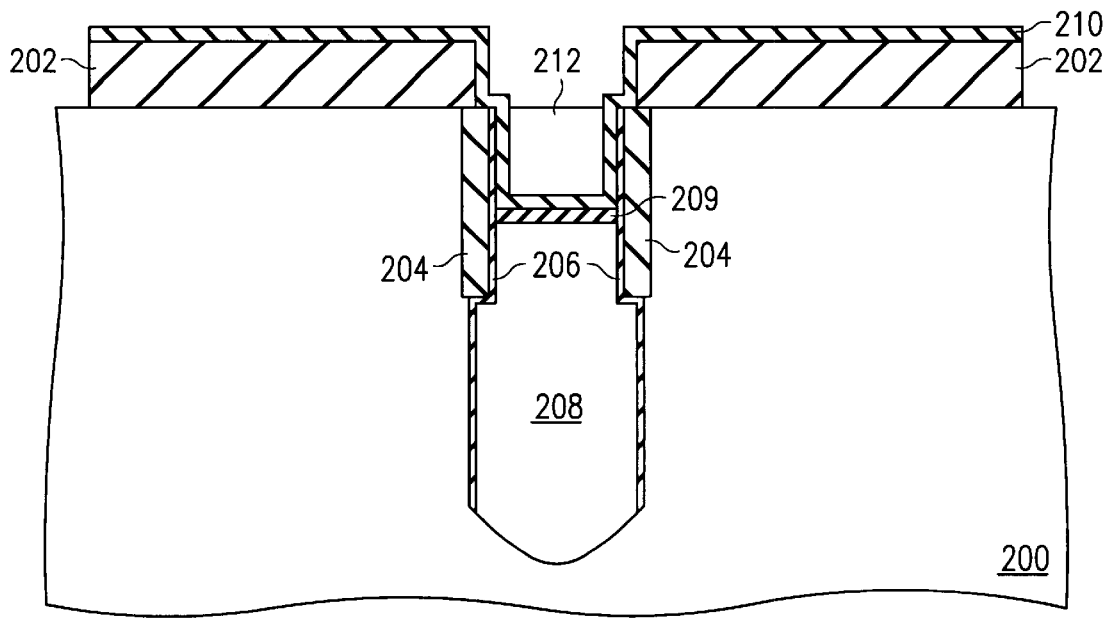

Referring now to FIG. 14, trench polysilicon 208 is oxidized to form a thin oxide layer 209 on the surface of trench polysilicon 208. Then a thin nitride layer 210 is conformally formed on the surface of the structure. Next, filler material 212 is deposited on the substrate, a CMP process is performed, and then a recessed process is performed to etch filler material 212 down to a level near the top of the trench. Preferably, filler material 212 is polysilicon, however, because it will simply be used as a masking material, it could be any other acceptable semiconductor processing material.

Figure 15:
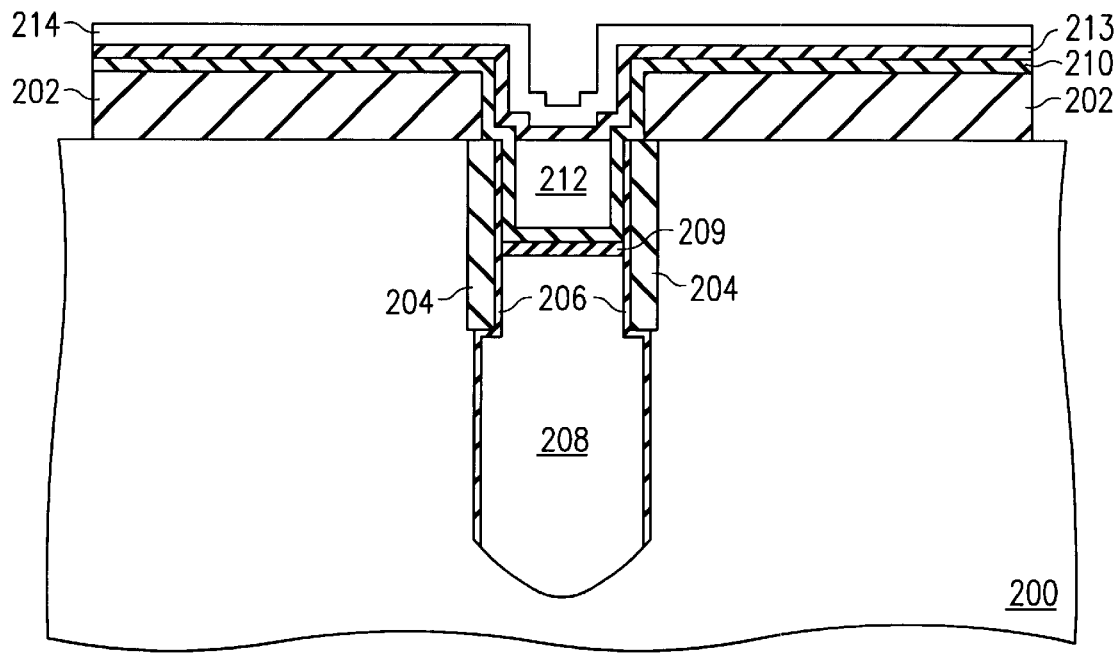
Figure 16:
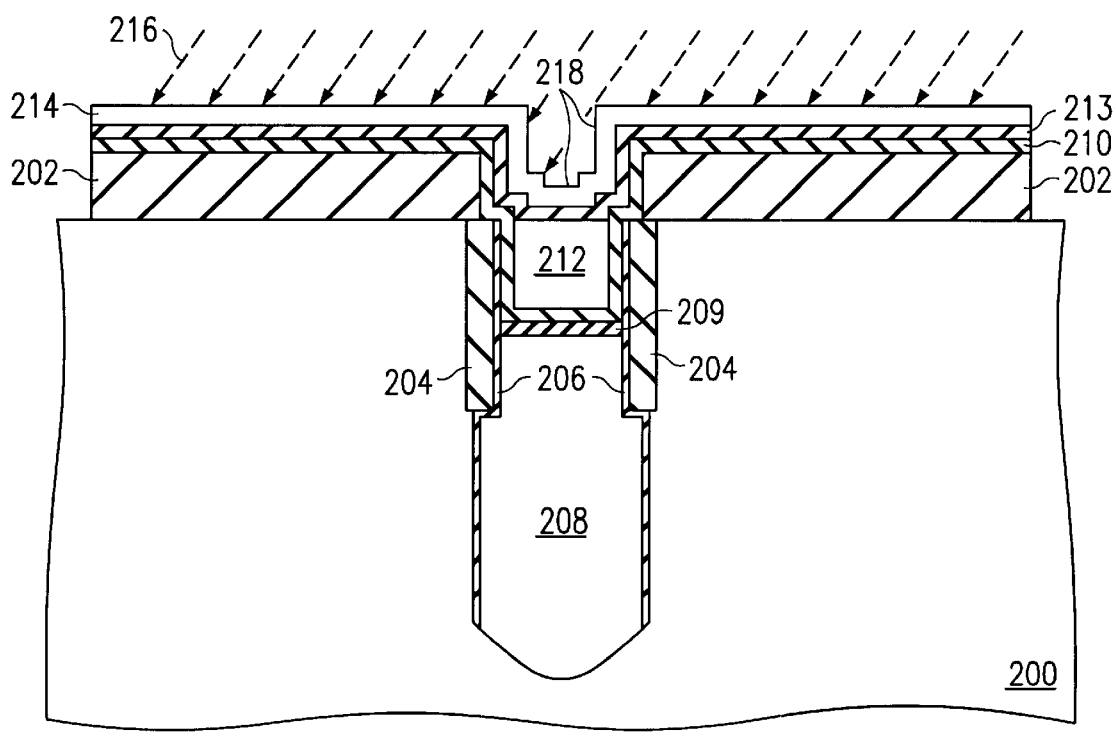

Referring to FIG. 15, a thin nitride layer 213 is conformally formed on the surface of the structure to provide process selectivity during subsequent processing. At this point, steps similar to those in the previous embodiment for depositing the polysilicon layer and angled implantation of the layer are now performed. Intrinsic polysilicon layer 214 is conformally deposited on the surface of the substrate, creating a low-aspect ratio structure overlying the trench. Next, low-angle implantation 216 is performed on the polysilicon layer 214, as shown in FIG. 16. Shielded regions 218 are protected from the dopant implant process by the vertical polysilicon sidewall, and thus remain undoped regions 218 shown in FIG. 16. Because the etch characteristics of the doped polysilicon and undoped polysilicon material regions are significantly different, one region can be selectively removed while leaving the other one on the substrate.

Figure 17:
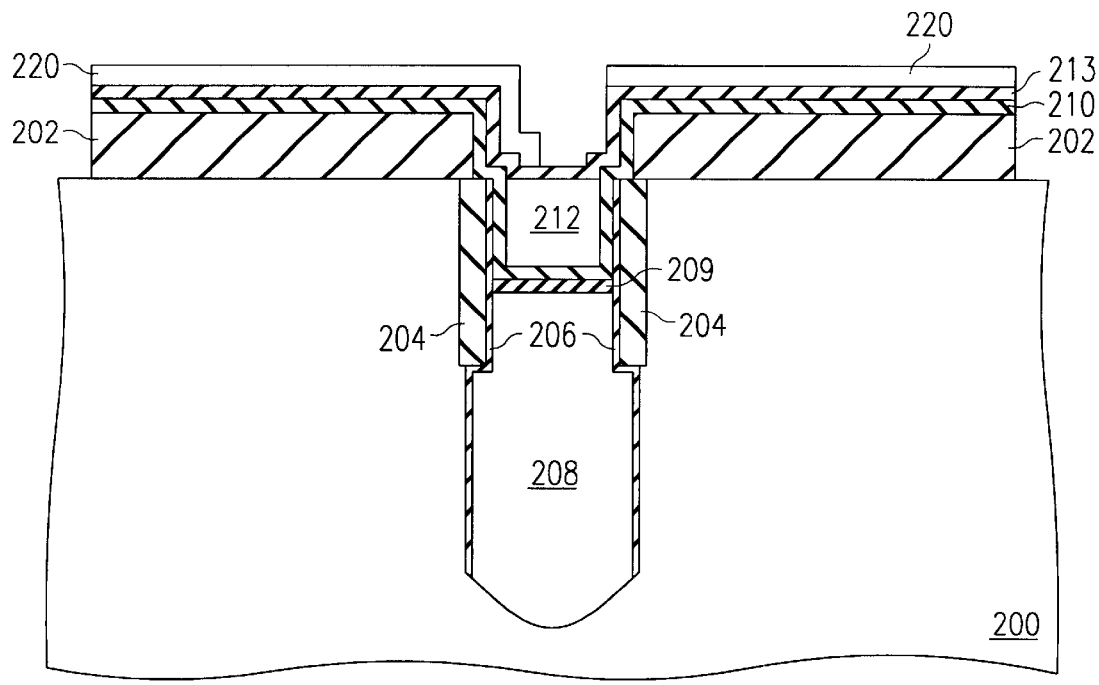
Figure 18:
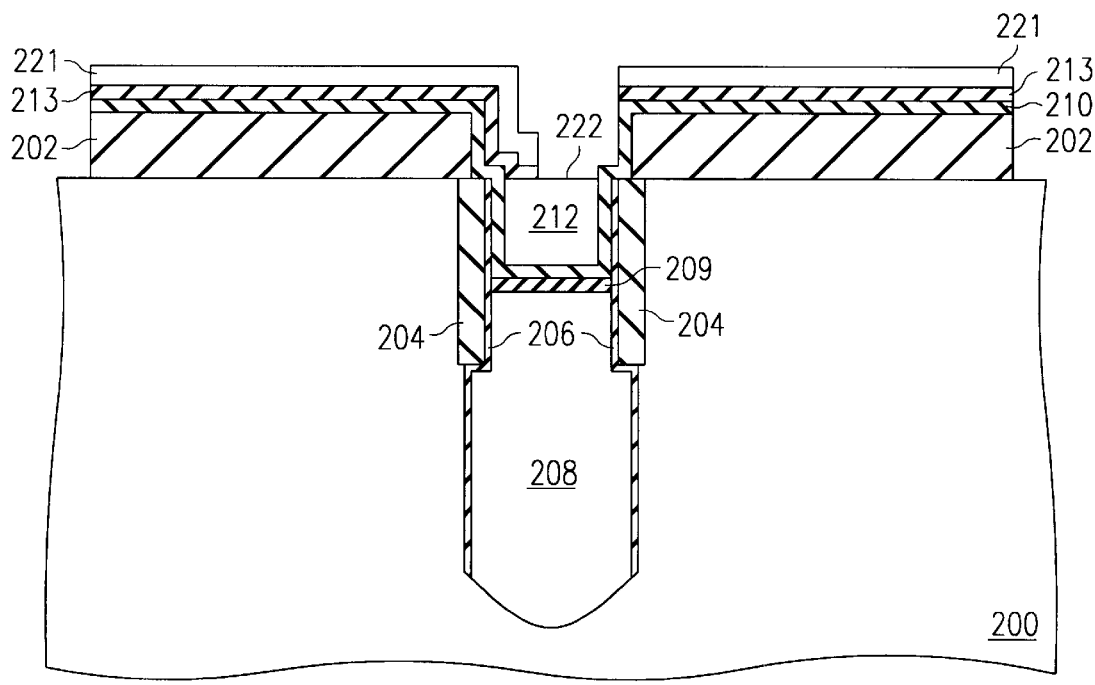

Referring to FIG. 17, a selective etch is performed to remove undoped polysilicon regions 218 and expose a portion of thin nitride layer 213. Doped polysilicon regions 220 remain on the substrate to mask the respective underlying portions of thin nitride layer 213. Referring to FIG. 18, doped polysilicon layer 220 is oxidized to form hard oxide mask 221 for the subsequent dry etching process. Thin silicon nitride layer 213 is then etched to expose surface 222 of underlying filler material 212. The region of filler material 212 which is underlying the remaining portions of doped polysilicon layer 220 and silicon nitride layer 213 is still masked by these layers. Because these etches are selective, generally any type of etch may be used, such as isotropic or anisotropic, or wet or dry.

Figure 19:
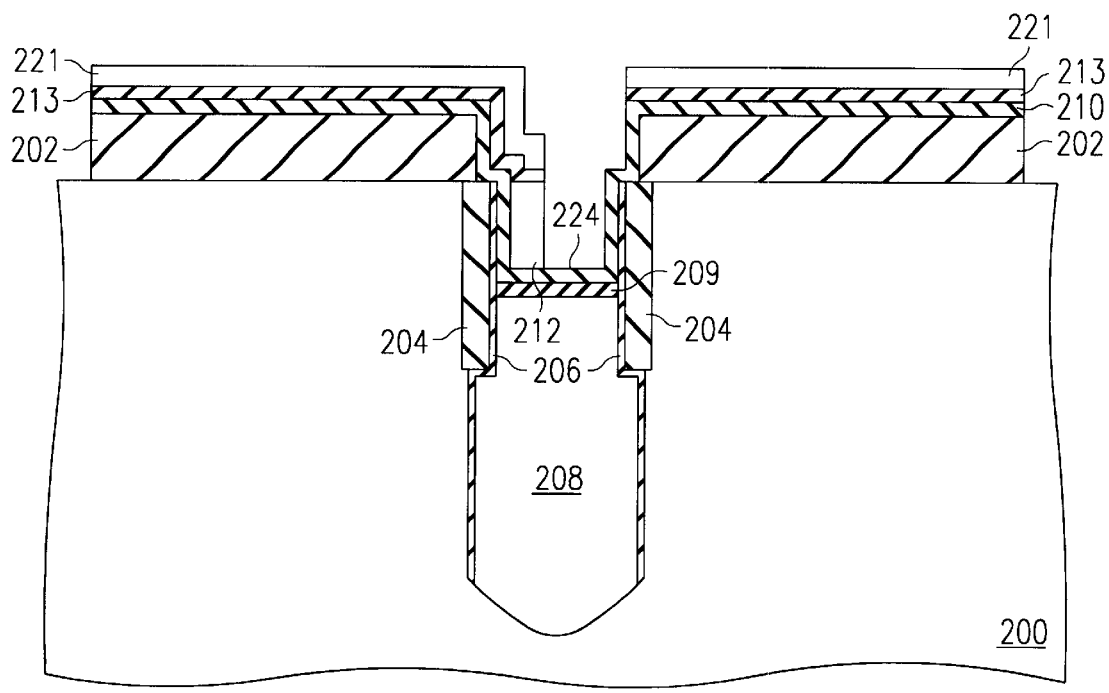
Figure 20:
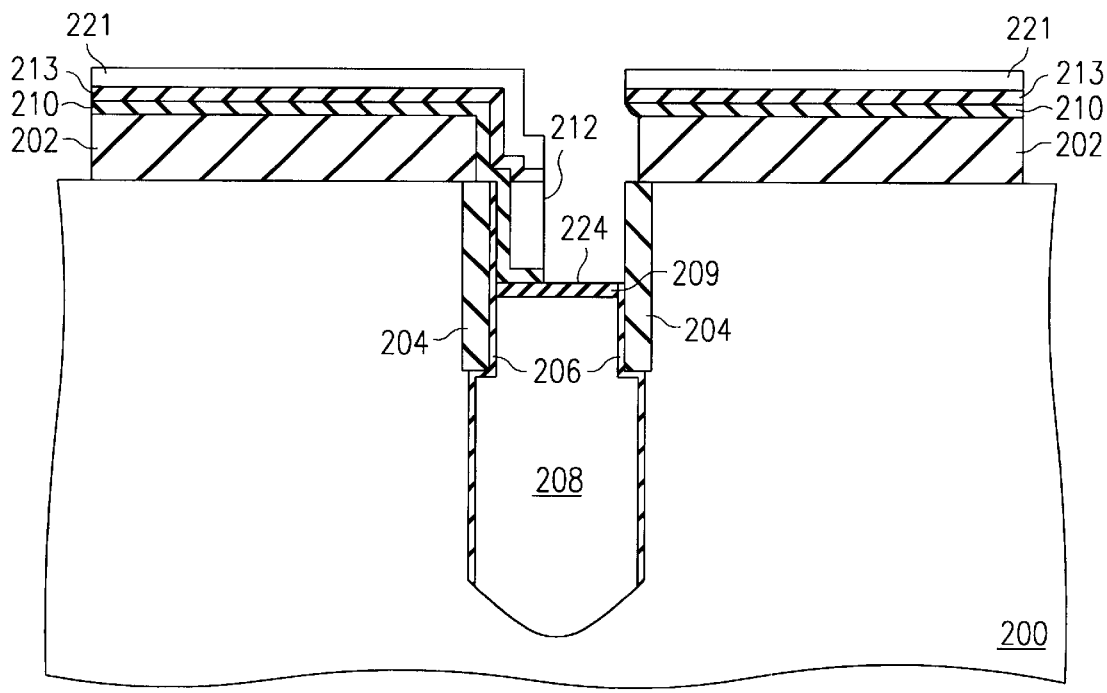

Referring to FIG. 19, an anisotropic reactive ion etch is used to remove the exposed portion of filler material 212 from the trench down to nitride layer 210. Referring to FIG. 20, the silicon nitride layer 210, along with a portion of node dielectric 206 on one side of the trench, is etched to expose collar oxide 204 on that side of the trench.

Figure 21:
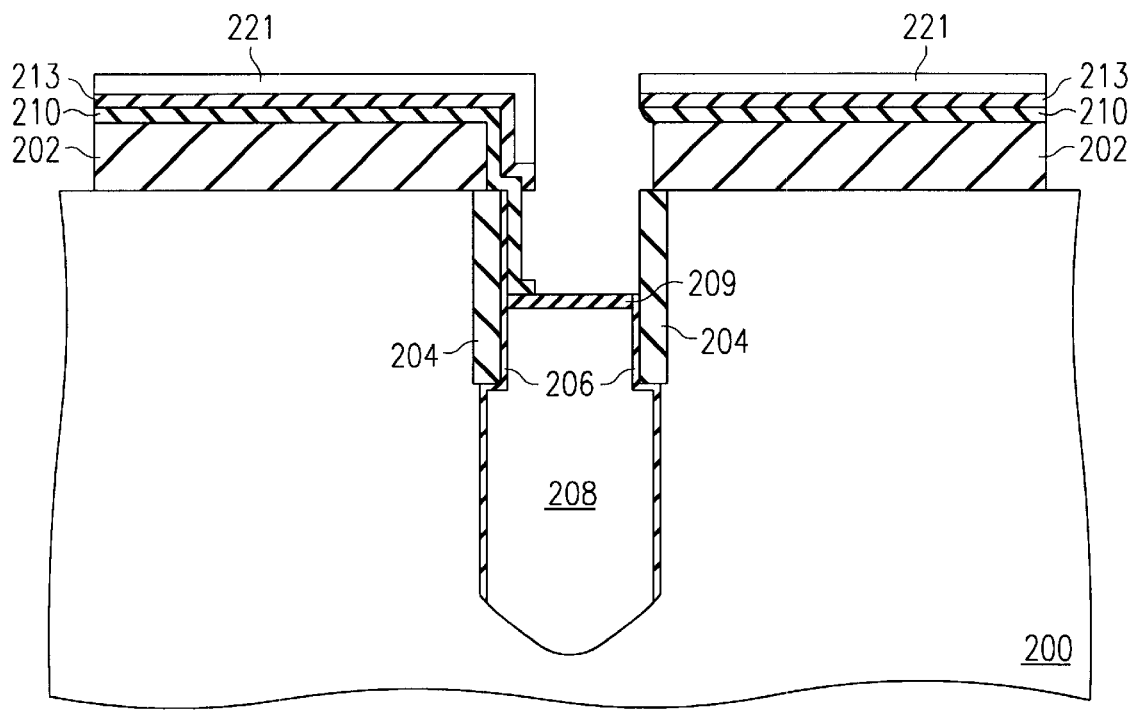
Figure 22:
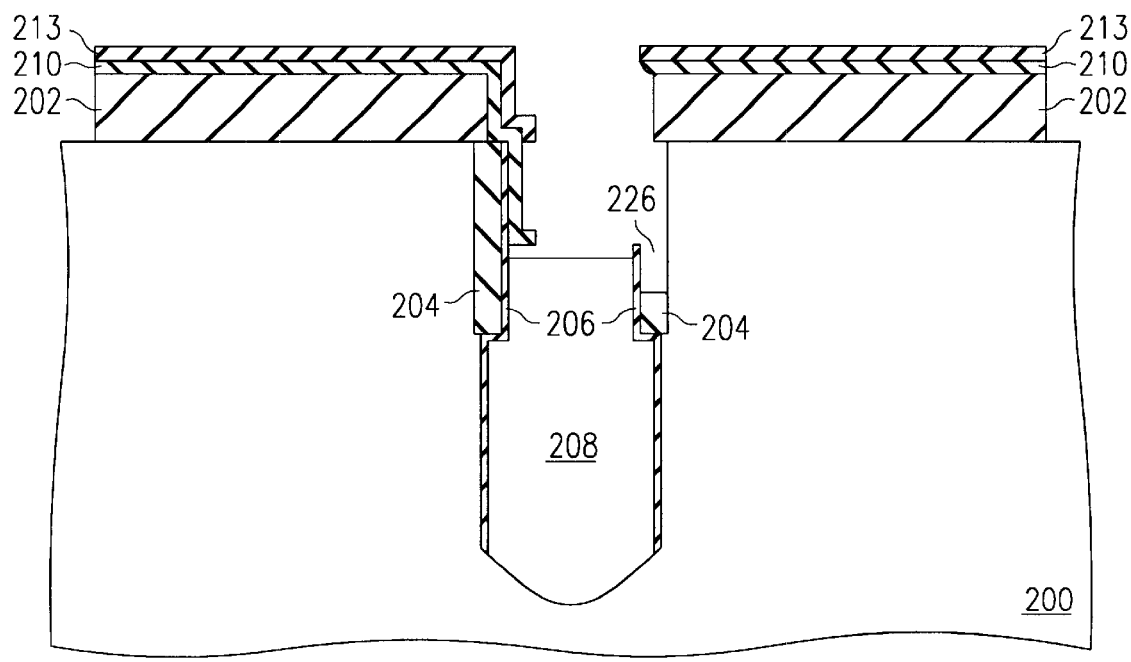
Figure 23:
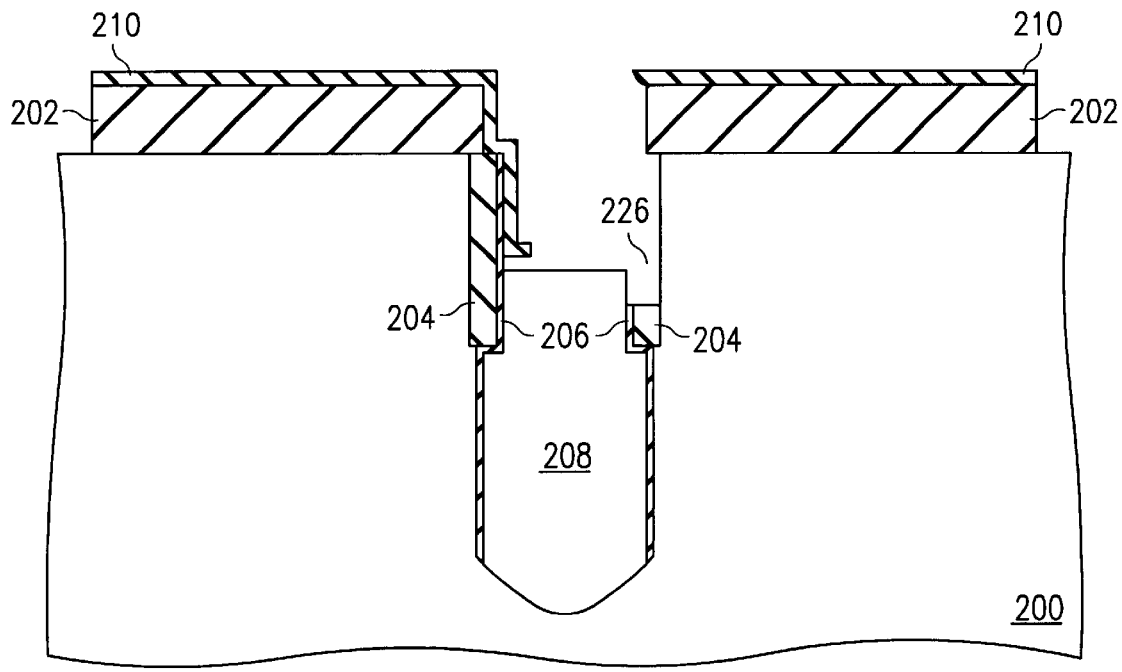

Referring to FIG. 21, a wet polysilicon etch is used to remove remaining polysilicon filler material 212. In FIG. 22, the exposed portion of collar oxide 204 is removed from the right side of the trench with an oxide etch, and is over etched so as to create divot 226 between node dielectric 206 and silicon substrate 200. The oxide etch also removes oxide layer 209 overlying polysilicon layer 208, and removes hard oxide mask 221. To complete the divot, a nitride etch is used to remove node dielectric 206 from region 226 in the divot, as shown in FIG. 23. This also has the effect of removing thin nitride layer 213, and possibly portions of silicon nitride layer 210 and node dielectric 206 on the left side of the trench.

Figure 24:
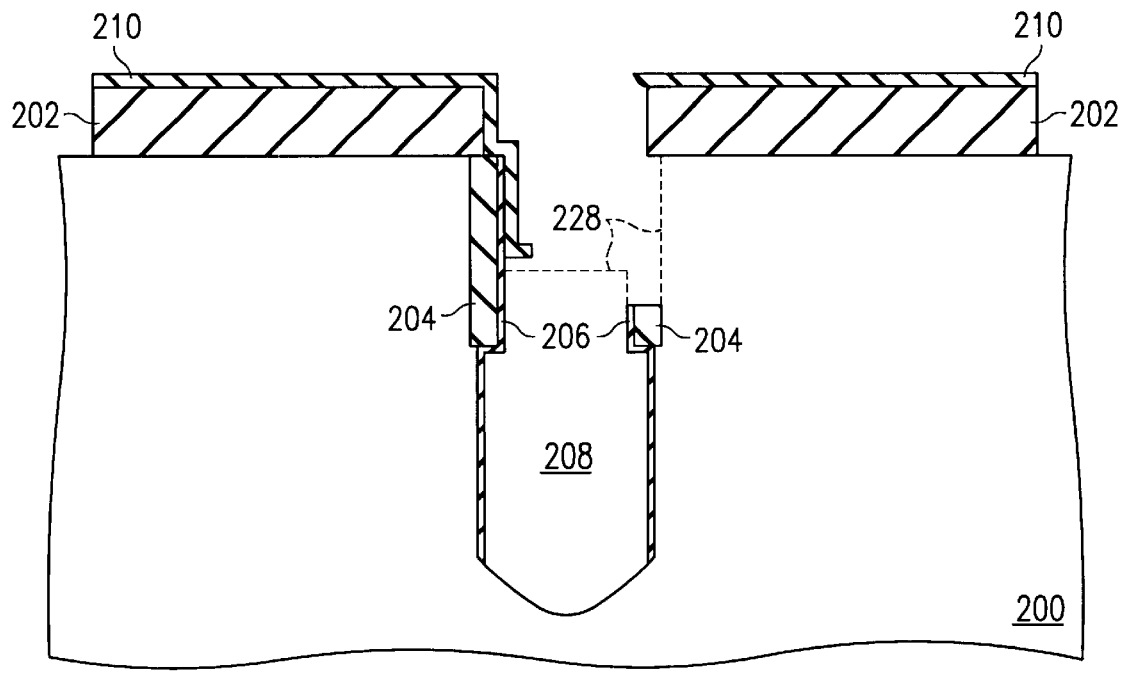

As with the prior embodiment, the exposed silicon surfaces are nitrided to form nitrided surfaces 228, as shown in FIG. 24. The remaining steps are analogous to those used in the prior embodiment, as discussed with respect to FIGS. 9–12 above. Finally, the remainder of a DRAM cell, including connections to word and bit lines, may be completed using conventional DRAM processing techniques. The resulting DRAM may then be employed in a variety of commercial and consumer electronics devices, including computers.

There are many alternative materials and processes which could be substituted for those disclosed in the above embodiments by one of ordinary skill in the art, and all such alternatives are considered to be within the scope of the present invention. For example, various other low-aspect mask structures, and low-angle implant processes, along with other aspect ratios and angles, may be used in accordance with the present invention. As another example, the implanted regions of the mask layer were removed in above embodiments, but alternatively the non-implanted regions may be removed, leaving the implanted regions on the substrate as a mask for a portion of the trench. As yet another example, p-type materials or doping may be substituted for n-type materials and doping, and vice versa. In addition, the order of process steps may be rearranged by one of ordinary skill in the art, yet still be within the scope of the present invention. As used herein, devices, layers, materials, etc. may be described, for example, as being "in" a trench, or formed "on" a trench sidewall surface, and all such descriptions are generally intended to include such devices, layers, and materials extending into regions proximate the trench or sidewall surface where appropriate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an electrical connection to an interior plate of a trench capacitor located in a deep trench on a semiconductor substrate, said method comprising:

low-angle implanting a dopant into exposed regions of a mask layer overlying said semiconductor substrate, wherein said mask layer comprises a low-aspect ratio well over said deep trench, and wherein a shielded region of said mask layer overlying said deep trench is shielded from said implanting by a sidewall of said well and thereby remains undoped;

removing said undoped shielded region of said mask using a dopant-level selective semiconductor process, thereby exposing a first region of said deep trench, wherein a second region of said deep trench remains masked; and forming a buried strap in said first region of said deep trench, wherein said buried strap electrically connects said interior plate to a portion of an upper substrate sidewall of said deep trench.

2. The method of claim 1, wherein said low-angle is about 80 degrees or less.

3. The method of claim 1, wherein said low-aspect ratio is about 3:1 or less.

4. The method of claim 1, wherein said dopant-level selective semiconductor process is selective oxidation followed by oxide etching.

5. The method of claim 1, wherein said dopant-level selective semiconductor process is a selective etch process.

6. The method of claim 5, wherein said mask layer is oxidized following said selective etch process.

7. The method of claim 1, wherein said mask layer is polysilicon.

8. The method of claim 1, wherein said doped exposed regions of said mask layer are removed.

9. The method of claim 1, wherein said implanted dopant is selected from the group consisting of: boron, arsenic, phosphorus, and combinations thereof.

10. A method of forming an electrical connection between an interior plate of a trench capacitor and a terminal of a vertical trench transistor, said capacitor and said transistor located in a deep trench on a semiconductor substrate, said method comprising:

forming an undoped mask layer overlying said substrate, said mask layer forming a well with sidewalls over said deep trench, said well having a low-aspect height to width ratio; low-angle implanting a dopant into said mask layer, wherein an exposed region of said mask layer overlying said deep trench becomes doped, and wherein a shielded region of said mask layer overlying said deep trench is shielded from said implanting by one of said well sidewalls and thereby remains undoped;

removing said undoped shielded region of said mask using a dopant-level selective semiconductor process, thereby exposing a first region of said deep trench, wherein a second region of said deep trench remains masked;

removing material from said first region of said deep trench, thereby exposing a upper substrate sidewall of said deep trench;

depositing a conductive layer to form a buried strap electrically connecting said interior plate to a portion of said upper substrate sidewall; and forming said transistor on said upper substrate sidewall in said first region of said deep trench, wherein said terminal of said transistor is electrically connected to said buried strap.

11. The method of claim 10, wherein said low-angle is about 80 degrees or less, and wherein said low-aspect ratio is about 3:1 or less.

12. The method of claim 10, wherein said dopant-level selective semiconductor process is selective oxidation followed by oxide etching.

13. The method of claim 10, wherein said dopant-level selective semiconductor process is a selective etch process.

14. The method of claim 13, wherein said mask layer is oxidized following said selective etch process.

15. The method of claim 10, wherein said mask layer is polysilicon.

16. The method of claim 10, wherein said doped exposed regions of said mask layer are removed.

17. The method of claim 10, wherein said implanted dopant is selected from the group consisting of: boron, arsenic, phosphorus, and combinations thereof.

18. A method of forming a dynamic random access memory (DRAM) integrated circuit, said method comprising:

forming a storage capacitor in a deep trench in a semiconductor substrate, said capacitor having an interior plate located inside said deep trench;

forming an undoped mask layer overlying said substrate, said mask layer forming a well with sidewalls over said deep trench, said well having a low-aspect height to width ratio;

low-angle implanting a dopant into said mask layer, wherein an exposed region of said mask layer overlying said deep trench becomes doped, and wherein a shielded region of said mask layer overlying said deep trench is shielded from said implanting by one of said well sidewalls and thereby remains undoped;

removing said undoped shielded region of said mask using a dopant-level selective semiconductor process, thereby exposing a first region of said deep trench, wherein a second region of said deep trench remains masked;

removing material from said first region of said deep trench, thereby exposing a upper substrate sidewall of said deep trench;

depositing a conductive layer to form a buried strap electrically connecting said interior plate to a portion of said upper substrate sidewall; and forming a vertical transistor on said upper substrate sidewall, wherein a terminal of said transistor is electrically connected to said buried strap.

19. The method of claim 18, wherein said forming a storage capacitor comprises:

forming a deep trench in said substrate;

forming a collar oxide on an upper interior surface of said deep trench, leaving a lower portion of said deep trench uncovered with said collar oxide;

forming a first plate in said substrate adjacent said deep trench;

forming a node dielectric on an interior surface of said deep trench and covering said collar oxide, and forming said interior plate on an interior surface of said node dielectric and filling at least a portion of an interior of said deep trench.

20. The method of claim 18, wherein said forming said vertical transistor comprises:

forming a drain in said substrate adjacent a lower portion of said upper substrate sidewall as said terminal electrically connected to said buried strap;

forming a vertical gate insulator in said trench on said upper substrate sidewall;

forming a gate in said trench adjacent said gate insulator; and forming a source terminal in said substrate adjacent an upper portion of said upper substrate sidewall.

21. The method of claim 18, wherein said low-angle is about 80 degrees or less, and wherein said low-aspect ratio is about 3:1 or less.

22. The method of claim 18, wherein said dopant-level selective semiconductor process is selective oxidation followed by oxide etching.

23. The method of claim 18, wherein said dopant-level selective semiconductor process is a selective etch process.

24. The method of claim 23, wherein said mask layer is oxidized following said selective etch process.

25. The method of claim 18, wherein said mask layer is polysilicon.

26. The method of claim 18, wherein said doped exposed regions of said mask layer are removed.

27. The method of claim 18, wherein said implanted dopant is selected from the group consisting of: boron, arsenic, phosphorus, and combinations thereof.

* * * * *